(12) United States Patent
Kwon et al.

(10) Patent No.: US 8,575,598 B2
(45) Date of Patent: Nov. 5, 2013

(54) ORGANIC LIGHT EMITTING DIODE DISPLAY

(75) Inventors: Do-Hyun Kwon, Yongin (KR);
Choong-Youl Im, Yongin (KR);
Dae-Hyun No, Yongin (KR); Ju-Won Yoon, Yongin (KR); Jong-Mo Yeo, Yongin (KR); Song-Yi Jeon, Yongin (KR); Il-Jeong Lee, Yongin (KR);
Cheol-Ho Yu, Yongin (KR); Young-Dae Kim, Yongin (KR); Jin-Gyu Kang, Yongin (KR); Gyoo-Chul Jo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 291 days.

(21) Appl. No.: 12/801,686

(22) Filed: Jun. 21, 2010

(65) Prior Publication Data

US 2011/0084279 A1   Apr. 14, 2011

(30) Foreign Application Priority Data

Oct. 9, 2009   (KR) ........................ 10-2009-0096338

(51) Int. Cl.
*H01L 29/08* (2006.01)
*H01L 35/24* (2006.01)
*H01L 51/00* (2006.01)

(52) U.S. Cl.
USPC ................................ 257/40; 257/59; 257/79

(58) Field of Classification Search
USPC .............. 257/750, E51.08, E51.09, 51.026, 257/E21.476, E21.477, 79, 81, 88, 89, 918, 257/E33.001, E33.062, E33.063, E33.064, 257/E33.065, 40, 91; 438/22, 29, 99, 584, 438/605, 608, 609, 688; 349/139, 140, 143, 349/147, 148, FOR. 129
See application file for complete search history.

(56) References Cited

U.S. PATENT DOCUMENTS

| 5,834,894 | A | * | 11/1998 | Shirasaki et al. | 313/509 |
|---|---|---|---|---|---|
| 6,366,017 | B1 | * | 4/2002 | Antoniadis et al. | 313/506 |
| 7,190,111 | B2 | | 3/2007 | Lee et al. | |
| 7,365,488 | B2 | | 4/2008 | Lee et al. | |
| 2003/0234608 | A1 | | 12/2003 | Lee et al. | |
| 2004/0012028 | A1 | | 1/2004 | Park et al. | |
| 2004/0171182 | A1 | * | 9/2004 | Yamazaki et al. | 438/22 |
| 2004/0245917 | A1 | | 12/2004 | Lu et al. | |
| 2005/0062039 | A1 | * | 3/2005 | Kim | 257/40 |
| 2005/0253504 | A1 | * | 11/2005 | Su | 313/504 |
| 2006/0091791 | A1 | | 5/2006 | Shin | |
| 2006/0192481 | A1 | | 8/2006 | Nagayama et al. | |
| 2006/0202611 | A1 | * | 9/2006 | Hayashi | 313/504 |
| 2007/0216287 | A1 | * | 9/2007 | Itagaki et al. | 313/503 |
| 2007/0241663 | A1 | | 10/2007 | Huang et al. | |
| 2008/0111484 | A1 | * | 5/2008 | Kwon et al. | 313/506 |
| 2008/0258612 | A1 | * | 10/2008 | Kim et al. | 313/504 |

FOREIGN PATENT DOCUMENTS

| JP | 06005369 | 1/1994 |
|---|---|---|
| JP | 2001507167 | 5/2001 |

(Continued)

*Primary Examiner* — Olik Chaudhuri
*Assistant Examiner* — Quovaunda V Jefferson
(74) *Attorney, Agent, or Firm* — Robert E. Bushnell, Esq.

(57) ABSTRACT

An organic light emitting diode display that includes a first electrode arranged on a substrate, an organic emission layer arranged on the first electrode and a second electrode arranged on the organic emission layer, the first electrode includes a first layer, a second layer and a third layer stacked sequentially on the organic emission layer, the second layer has a lower work function than the third. Here, the second layer has a higher work function than that of the third layer.

13 Claims, 5 Drawing Sheets

FOREIGN PATENT DOCUMENTS

| | | |
|---|---|---|
| JP | 2006-236839 | 9/2006 |
| KR | 10-2003-0010136 | 2/2003 |
| KR | 10-0390680 | 6/2003 |
| KR | 10-2004-0000630 | 1/2004 |
| KR | 10-0477746 | 3/2005 |
| KR | 1020080083360 A | 9/2008 |
| WO | 9939393 | 8/1999 |
| WO | WO 2006054137 * | 5/2006 |

* cited by examiner

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on 9 Oct. 2009 and there duly assigned Serial No. 10-2009-0096338.

BACKGROUND OF THE INVENTION

1. Field of the Invention

The described technology relates generally to an organic light emitting diode display that includes electrodes facing each other and an organic emission layer that emits light.

2. Description of the Related Art

In general, an organic light emitting diode display includes an anode and a cathode facing each other, and an organic emission layer interposed between the anode and the cathode. In such an organic light emitting diode display, the anode injects holes into the organic emission layer, and the cathode injects electrons into the organic emission layer. Among them, the anode is preferably made out of a conductive material having a high work function in order to enhance hole injection.

SUMMARY OF THE INVENTION

The described technology has been made in an effort to provide an organic light emitting diode display that includes an anode that includes a plurality of layers while suppressing a decrease in work function.

One aspect of the present invention provides an organic light emitting diode display including a first electrode arranged on a substrate, an organic emission layer arranged on the first electrode and a second electrode arranged on the organic emission layer, wherein the first electrode includes a first layer, a second layer and a third layer stacked sequentially on the organic emission layer, the second layer has a higher work function than that of the third layer.

The first layer may have a higher work function than the second layer. The second layer may be thinner than each of the first layer and the third layer. The organic light emitting diode display may also include a thin film transistor arranged on the substrate and including a source electrode and a drain electrode, the source electrode and the drain electrode each include the first layer, the second layer and the third layer. The second layer may include one or more of silver (Ag), molybdenum (Mo), tungsten (W), nickel (Ni) and platinum (Pt). The first electrode may also include a fourth layer arranged on the third layer, the first layer may include indium tin oxide (ITO), the third layer may include aluminum (Al), and the fourth layer may include a different conductive material than that of the third layer. The second layer may include silver (Ag). The organic light emitting diode display may also include an interlayer insulating layer arranged directly on the third layer, the first layer may include indium tin oxide (ITO) and the third layer may include a different conductive material than that of the second layer. The organic light emitting diode display may also include an interlayer insulating layer arranged directly on the third layer, the first layer includes a nickel oxide (NiOx), the second layer includes aluminum (Al) and the third layer includes a different conductive material than that of the second layer. The first layer may be doped with lithium.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
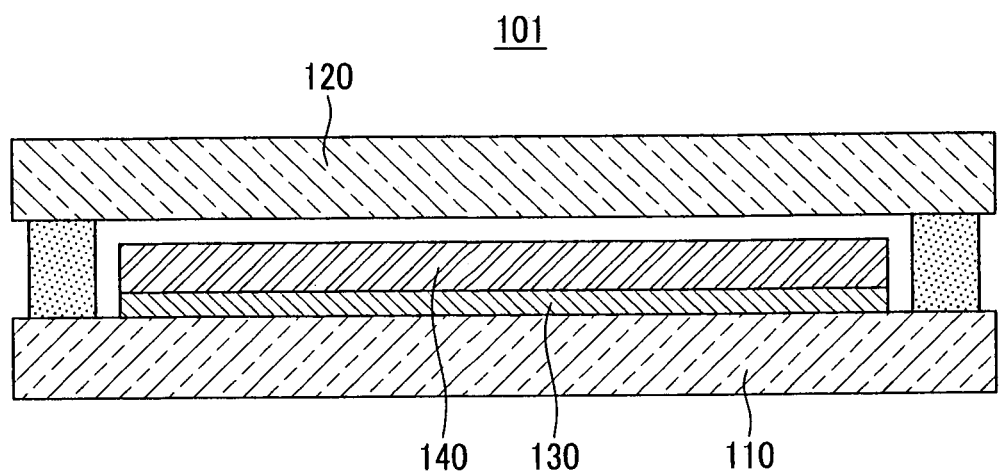
FIG. 1 is a cross-sectional view schematically showing an organic light emitting diode display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Also, among several exemplary embodiments, a first exemplary embodiment will be representatively described, and the other exemplary embodiments will be described only with respect to components that differ from those of the first exemplary embodiment.

To clearly describe the present invention, parts not related to the description are omitted, and like reference numerals designate like components throughout the specification.

In the drawings, the sizes and thicknesses of the components are merely shown for convenience of explanation, and therefore the present invention is not necessarily limited to the illustrations described and shown herein.

In, the drawings, the thickness of layers, films, panels, regions, etc., are exaggerated for clarity. In the drawings, the thicknesses of some layers and areas are exaggerated for convenience of explanation. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Thus, although the accompanied drawings illustrate an active matrix (AM) type of organic light emitting display panel having a 2Tr-1Cap structure in which one pixel includes two thin film transistors (TFTs) and one capacitor, the present invention is not limited thereto. Therefore, the number of thin film transistors, the number of capacitors, and the number of lines of the organic light emitting display panel are not limited. A pixel is the smallest unit displaying an image, and the organic light emitting panel displays an image through a plurality of pixels.

In general, an organic light emitting diode display includes an anode and a cathode facing each other, and an organic emission layer interposed between the anode and the cathode.

In such an organic light emitting diode display, the anode injects holes into the organic emission layer, and the cathode injects electrons into the organic emission layer. Among them, the anode is preferably made out of a conductive material having a high work function in order to enhance hole injection.

Recently, an organic light emitting diode display having a top emission structure to optimize the aperture ratio has been adopted. In such an organic light emitting diode display having a top emission structure, the anode has a light reflecting structure, and the cathode has a light transmitting structure. Light generated from the organic emission layer is made visible on the outside through the cathode, and is reflected by the anode and transmitted through the cathode to be visible on the outside.

In a case where the anode having such a light reflecting structure includes a plurality of layers to enhance light reflectance and hole injection, the light reflection efficiency is further improved as compared to the anode employing just a single layer, but neighboring layers among the plurality of layers constituting the anode are made out of different metallic materials, thus lowering the work function compared to a single layer anode.

In particular, in the case of an anode having an indium tin oxide (ITO) layer for hole injection and an aluminum (Al) layer for light reflection stacked thereon, the work function at the interface between the indium tin oxide layer and the aluminum layer is low compared to the work function of the indium tin oxide layer, thus causing the anode to decrease in terms of hole injection capability into the organic emission layer.

Now, an organic light emitting diode display according to a first exemplary embodiment will be described with reference to FIGS. 1 to 4.

FIG. 1 is a cross-sectional view schematically showing an organic light emitting diode display 101 according to a first exemplary embodiment. As shown in FIG. 1, the organic light emitting diode display 101 according to the first exemplary embodiment includes a first substrate 110, a second substrate 120, a driving circuit 130, and an organic light emitting diode 140.

The first substrate 110 is an insulation substrate made of glass, quartz, ceramic, plastic, or the like, however the first exemplary embodiment is not limited thereto and the first substrate 110 may instead be a metallic substrate made of stainless steel or the like.

The second substrate 120 faces the first substrate 110, and covers the driving circuit 130 and the organic light emitting diode 140. The second substrate 120 is made out of a transparent material such as glass, quartz, ceramic, plastic, or the like.

The driving circuit 130 and the organic light emitting diode 140, which are formed on the first substrate 110, are arranged between the first substrate 110 and the second substrate 120. The driving circuit 130 includes switching and driving thin film transistors 10 and 20 (shown in FIG. 2) to drive the organic light emitting diode 140. The organic light emitting diode 140 emits light in response to a driving signal transmitted from the driving circuit 130 and displays an image in an upward direction, which is the direction of the second substrate 120.

Figure 2:
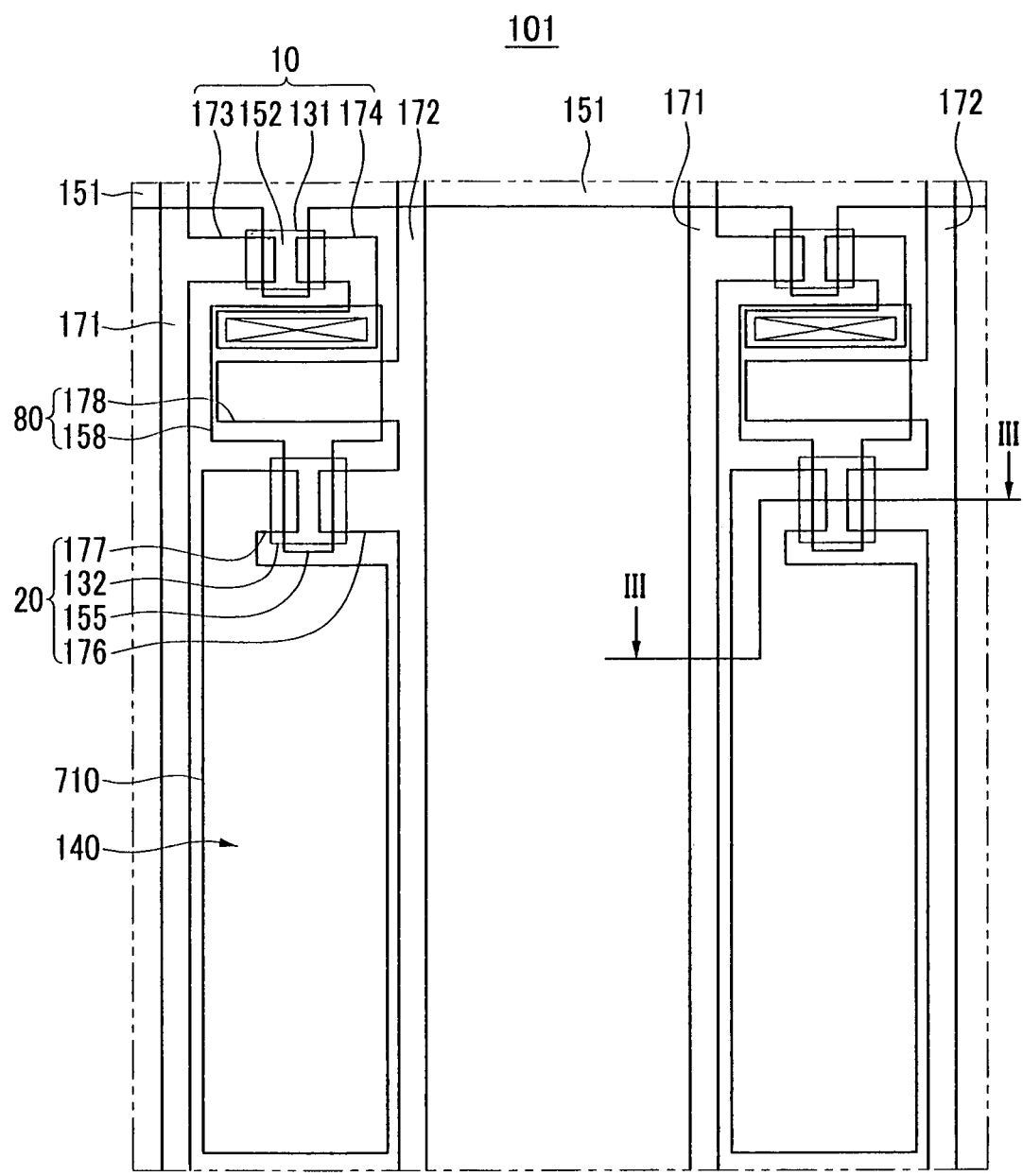
FIG. 2 is a layout view showing a structure of a pixel of the organic light emitting diode display according to the first exemplary embodiment.
Figure 3:
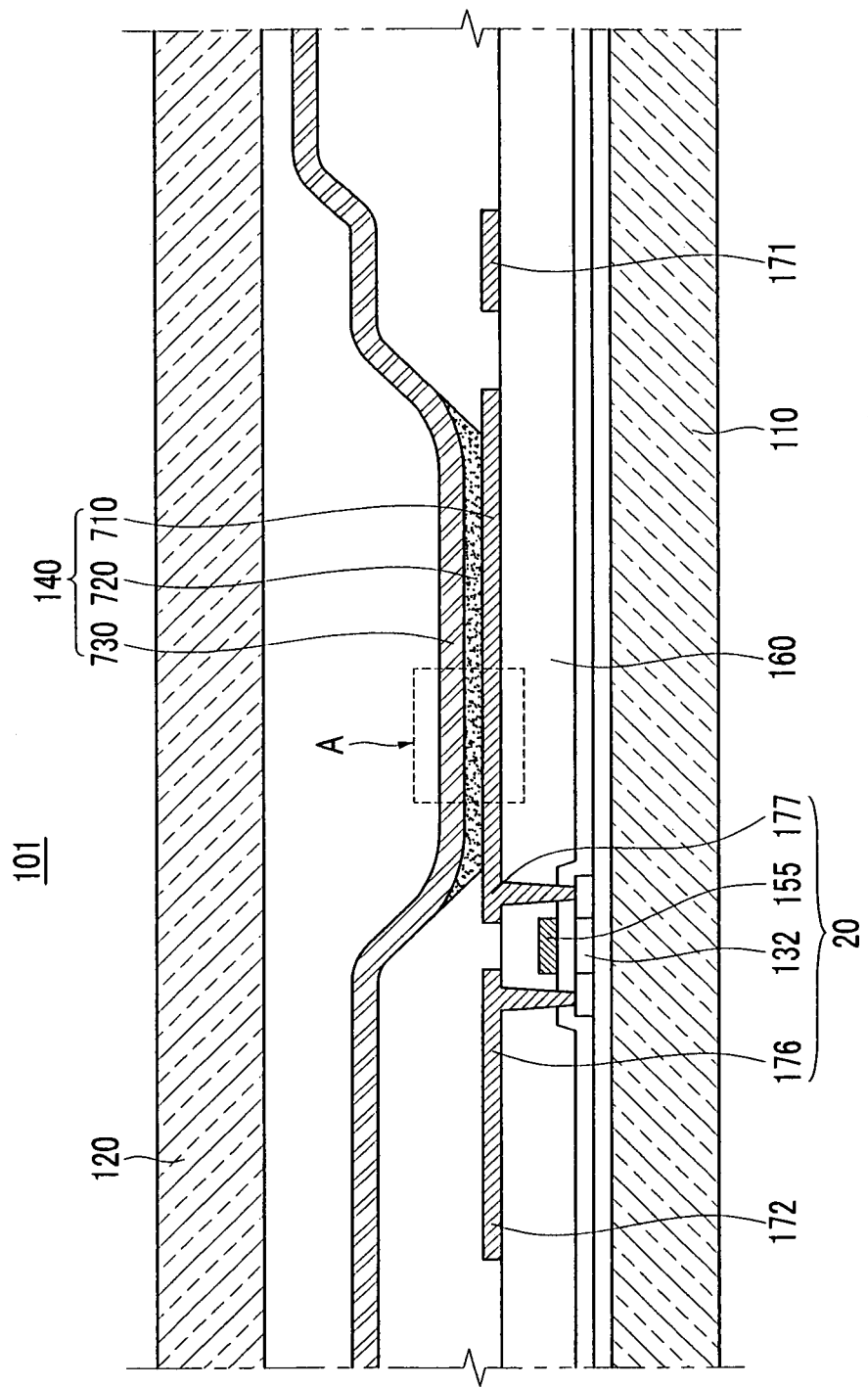
FIG. 3 is a cross-sectional view taken alone line of FIG. 2.

Although concrete structures of the organic light emitting diode 140 and the driving circuit 130 are shown in FIGS. 2 and 3, the exemplary embodiment is not limited to the structures of FIGS. 2 and 3. The organic light emitting diode 140 and the driving circuit 130 can instead have other various structures and still be within the scope of the present invention.

Now, the internal structure of the organic light emitting diode display 101 according to the first exemplary embodiment will be described in detail with reference to FIGS. 2 and 3. FIG. 2 is a layout view showing a structure of a pixel of the organic light emitting diode display 101 according to the first exemplary embodiment and FIG. 3 is a cross-sectional view taken along line III-III of FIG. 2.

As illustrated in FIG. 2 and FIG. 3, each pixel of the organic light emitting diode display 101 includes a switching thin film transistor 10, a driving thin film transistor 20, a capacitor 80, and an organic light emitting diode 140. Here, the combination of the switching thin film transistor 10, the driving thin film transistor 20, and the capacitor 80 is referred to as the driving circuit 130. The driving circuit 130 further includes a gate line 151 arranged along one direction, a data line 171 insulated from and crossing the gate line 151, and a common power line 172. One pixel may be defined by the gate line 151, the data line 171, and the common line 172, but the present invention is not necessarily limited thereto.

The organic light emitting diode 140 includes a first electrode 710, an organic emission layer 720 formed on the first electrode 710, and a second electrode 730 formed on the organic emission layer 720. Here, the first electrode 710 is a positive (+) electrode serving as a hole injection electrode, and the second electrode 730 is a negative (−) electrode serving as an electron injection electrode. That is, holes and electrons are injected into the organic emission layer 720 from the first electrode 710 and the second electrode 730, respectively, and when excitons formed by recombinations of the injected holes and electrons drop from an excited state to a ground state, the organic emission layer 720 emits light.

The first electrode 710 includes a plurality of layers, and a detailed configuration of the first electrode 710 will be described later.

Moreover, in the organic light emitting diode display 101 according to the first exemplary embodiment, the organic light emitting diode 140 emits light in the direction of the second substrate 120. That is, the organic light emitting diode 140 is a top emission type. Here, in order for the organic light emitting diode 140 to emit light in the direction of the second substrate 120, the first electrode 710 has a light reflecting structure and the second electrode 730 has a light transmitting structure.

The capacitor 80 includes a pair of capacitor plates 158 and 178 disposed with an interlayer insulating layer 160 interposed therebetween. Here, the interlayer insulating layer 160 is a dielectric material, and storage capacity is determined by the electric charges stored in the capacitor 80 and the voltage difference between the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177. The driving source electrode 176, the driving drain electrode 177 and the first electrode 710 are produced simultaneously and each includes a plurality of layers.

The switching thin film transistor 10 is used as a switching element to select a pixel to emit light. The switching gate electrode 152 is connected to the gate line 151, the switching source electrode 173 is connected to the data line 171 and the switching drain electrode 174 is spaced apart from the switching source electrode 173 and is connected to one of the capacitor plates (158 in this case).

The driving thin film transistor 20 applies driving power to the first electrode 710 to emit light from the organic emission layer 720 of the organic light emitting diode 140 in the selected pixel. The driving gate electrode 155 is connected to the capacitor plate 158 that is connected to the switching drain electrode 174. The driving source electrode 176 and the other capacitor plate 178 are connected to the common power line 172. The driving drain electrode 177 is arranged on the same layer as the first electrode 710 and is connected to the first electrode 710.

With the above-described configuration, the switching thin film transistor 10 is driven by a gate voltage applied to the gate line 151 and supplies a data voltage applied to the data line 171 to the driving thin film transistor 20. A voltage corresponding to the difference between the common voltage, which is supplied from the common power line 172 to the driving thin film transistor 20, and the data voltage, which is supplied from the switching thin film transistor 10, is stored in the capacitor 80. A current corresponding to the voltage stored in the capacitor 80 flows into the organic light emitting diode 140 through the driving thin film transistor 20 to make the organic light emitting diode 140 emit light. Light emission of the organic light emitting diode 140 is carried out when the first electrode 710 injects holes into the organic emission layer 720 and the second electrode 730 injects electrons into the organic emission layer 720.

Now, the plurality of layers constituting the first electrode 710 in the organic light emitting diode display 101 according to the first exemplary embodiment will be described in detail with reference to FIG. 4.

Figure 4:
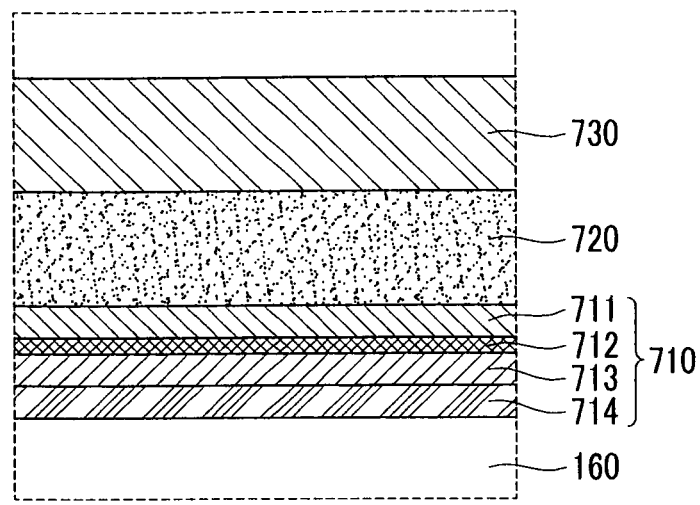
FIG. 4 is a cross-sectional view showing an enlargement of portion "A" of the organic light emitting diode display of FIG. 3 according to a first exemplary embodiment.

FIG. 4 is a cross-sectional view enlarging a portion A of FIG. 3. As shown in FIG. 4, the first electrode 710 of the organic light emitting diode 140 of the organic light emitting diode display 101 according to the first exemplary embodiment includes a first layer 711, a second layer 712, a third layer 713, and a fourth layer 714 that are stacked sequentially from the organic emission layer 720.

The first layer 711 faces the organic emission layer 720 and is made of indium tin oxide (ITO). The indium tin oxide constituting the first layer 711 has a work function of 4.7 to 5.8 eV, and has a relatively high work function compared to the second layer 712 and the third layer 713. Control of the work function of the indium tin oxide can be achieved by doping impurities into the indium tin oxide or by performing a plasma treatment on the surface of the indium tin oxide.

The second layer 712 is arranged between the first layer 711 and the third layer 713 and includes at least one of silver (Ag), molybdenum (Mo), tungsten (W), nickel (Ni), and platinum (Pt). The second layer 712 has a work function of 4.2 to 5.5 eV and has a relatively high work function compared to the third layer 713. Moreover, the second layer 712 has a relatively low work function compared to the first layer 711. The second layer 712 has a relatively small thickness compared to each of the first layer 711, the third layer 713, and the fourth layer 714, and preferably includes at least one of silver (Ag), molybdenum (Mo), tungsten (W), nickel (Ni), and platinum (Pt). As the second layer 712 has a relatively small thickness compared to the first layer 711 and the third layer 713, this increases interference of the second layer 712 with regard to hole transportation from the third layer 713 to the first layer 711 via the second layer 712. The reason why it is preferable for the second layer 712 to include silver (Ag) will be described later.

The third layer 713 is arranged between the second layer 712 and the fourth layer 714, and is made of aluminum (Al) and has a high reflectance. The aluminum constituting the third layer 713 has a work function of 3.7 to 3.8 eV, which is relatively low compared to the first layer 711 and the second layer 712, but has a high light reflection property, and its material cost is relatively low compared to that of the first layer 711 and the second layer 712.

The fourth layer 714 is made of a different conductive material than that of the third layer 713 and is preferably made of indium tin oxide, but is not limited thereto and may instead be made out of other various conductive materials.

As seen above, in the organic light emitting diode display 101 according to the first exemplary embodiment, the first electrode 710 includes a first layer 711, a second layer 712, a third layer 713, and a fourth layer 714 that are sequentially stacked from the organic emission layer 720. The first layer 711 has the highest work function of all of the first layer 711, the second layer 712, and the third layer 713, the second layer 712 has a higher work function than the third layer 713, and the third layer 713 has the lowest work function of all of the first layer 711, the second layer 712, and the third layer 713. That is, the work function of the second layer 712 has a value between the work function of the first layer 711 and the work function of the third layer 713.

In this manner, the second layer 712 of the first electrode 710, which is disposed between the neighboring first layer 711 and third layer 713, has a work function between the work function of the first layer 711 and the work function of the third layer 713, thereby suppressing a decrease in work function at the interface between the first layer 711 and the third layer 713. More specifically, the difference in work function between the second layer 712 and the third layer 713 is smaller than the difference in work function between the first layer 711 and the third layer 713, and the difference in work function between the second layer 712 and the first layer 711 is smaller than the difference in work function between the first layer 711 and the third layer 713. Thus, the second layer 712 serves as a bridge between the first layer 711 and the third layer 713, thereby suppressing a decrease in work function at the interface between the first layer 711 and the second layer 712 that are adjacent to the organic emission layer 720.

For example, in a case where the second layer 712 includes only silver (Ag) that has a work function of 4.2 to 4.3 eV, the work function of the second layer 712 has a value between the work function of the first layer 711 and the work function of the third layer 713. This suppresses a decrease in work function at the interface between the first layer 711 and the third layer 713 generated when the first layer 711 and the third layer 713 are in direct contact with each other. That is, the work function at the interface between the first layer 711 and the second layer 712 is higher than the work function at the interface between the first layer 711 and the third layer 713 generated when the first layer 711 and the third layer 713 are in direct contact with each other.

As seen above, in the organic light emitting diode display 101 according to the first exemplary embodiment, the second layer 712 is not simply interposed between the first layer 711 made of indium tin oxide and the third layer 713 made of aluminum. Instead, the second layer 712 having a work function between the work function of the first layer 711 and the work function of the third layer 713 is interposed between the first layer 711 and the third layer 713 so as to suppress a decrease in work function at the interface between the first layer 711 contacting the organic emission layer 720 and a neighboring layer by considering the difference in work function between the first layer 711 and the third layer 713.

Moreover, in the organic light emitting diode display 101 according to the first exemplary embodiment, the work function of the interface between the first layer 711 and the second layer 712 stacked from the organic emission layer 720 is higher than the work function at the interface between the interface between the first layer 711 and the third layer 713 generated when the first layer 711 and the third layer 713 are in direct contact with each other, thus improving the emission efficiency of the organic emission layer 720. Furthermore, the driving voltage for driving the organic emission layer 720 is lowered, so that the lifespan of the organic emission layer 720 is enhanced.

Now, an organic light emitting diode display according to a second exemplary embodiment will be described with reference to FIG. 5.

Figure 5:
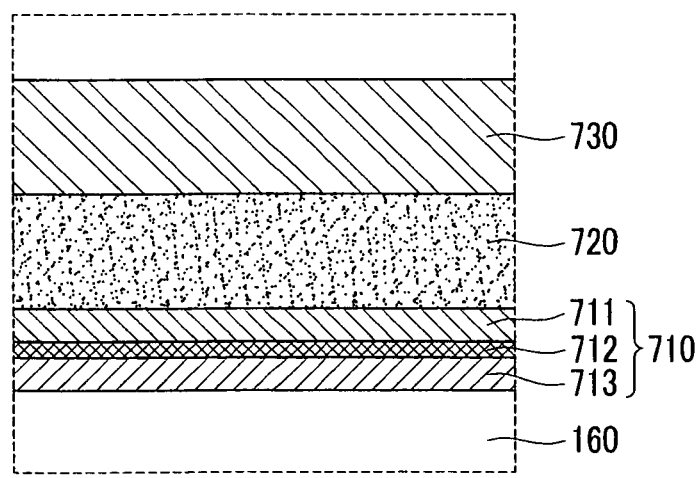
FIG. 5 is a cross-sectional view showing an enlargement of portion A of the organic light emitting diode display of FIG. 3 according to a second exemplary embodiment.

FIG. 5 is a cross-sectional view showing an enlargement of portion A of the organic light emitting diode display of FIG. 3 according to a second exemplary embodiment. As shown in FIG. 5, the first electrode 710 of the organic light emitting diode display 102 according to the second exemplary embodiment includes a first layer 711, a second layer 712, and a third layer 713 that are stacked sequentially from the organic emission layer 720.

The first layer 711 faces the organic emission layer 720, and is made of indium tin oxide (ITO). The indium tin oxide constituting the first layer 711 has a work function of 4.7 to 5.5 eV, and has a relatively high work function as compared to each of the second layer 712 and the third layer 713.

The second layer 712 is arranged between the first layer 711 and the third layer 713, and is made of silver (Ag). The second layer 712 has a work function of 4.2 to 4.3 eV, and has a value between the work function of the first layer 711 and the work function of the third layer 713.

The third layer 713 is made of a different conductive material than the second layer 712 and is preferably made out of aluminum (Al), but is not limited thereto and may instead be made out of other various conductive materials.

As seen above, in the organic light emitting diode display 102 according to the second exemplary embodiment, the work function of the second layer 712 has a value between the work function of the first layer 711 and the work function of the third layer 713. Thus, the work function at the interface between the first layer 711 and the second layer 712 stacked from the organic emission layer 720 is higher than the work function at the interface between the first layer 711 and the third layer 713 generated when the first layer 711 and the third layer 713 are in direct contact with each other. That is, the organic light emitting diode display 102 according to the second exemplary embodiment can suppress a decrease in work function at the interface of a neighboring layer, thus improving the emission efficiency of the organic emission layer 720. Furthermore, the driving voltage for driving the organic emission layer 720 is lowered, so the lifespan of the organic emission layer 720 is enhanced.

Now, an organic light emitting diode display according to a third exemplary embodiment will be described with reference to FIG. 6.

Figure 6:
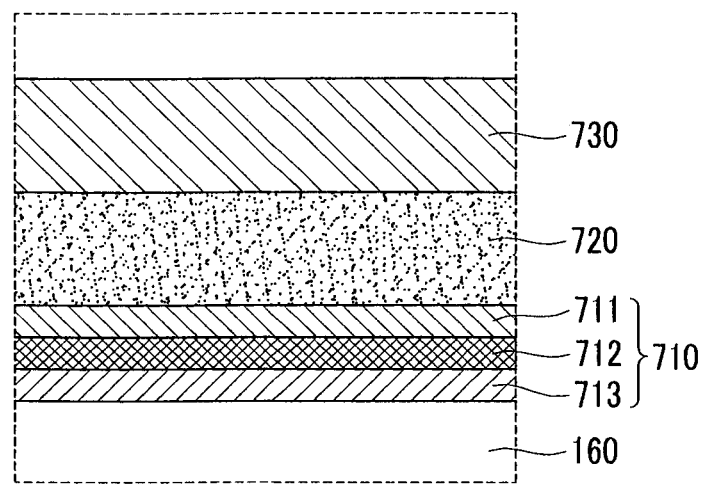
FIG. 6 is a cross-sectional view showing an enlargement of portion A of the organic light emitting diode display of FIG. 3 according to a third exemplary embodiment.

FIG. 6 is a cross-sectional view showing an enlargement of portion A of the organic light emitting diode display of FIG. 3 according to a third exemplary embodiment. As shown in FIG. 6, the first electrode 710 of the organic light emitting diode display 103 according to the third exemplary embodiment includes a first layer 711, a second layer 712, and a third layer 713 that are stacked sequentially from the organic emission layer 720.

The first layer 711 faces the organic emission layer 720 and is made out of a nickel oxide (NiOx) or a lithium-doped nickel oxide (Li-doped NiOx). The first layer 711 has a work function of 4.8 to 5.5 eV, which is higher than the work function of the second layer 712 and the work function of the third layer 713.

The second layer 712 is arranged between the first layer 711 and the third layer 713, and is made of aluminum. The second layer 712 has a work function of 3.7 to 3.8 eV, and has a value between the work function of the first layer 711 and the work function of the third layer 713. The third layer 713 is made of a different conductive material than that of the second layer 712 and has a lower work function value than that of the second layer 712.

As seen above, in the organic light emitting diode display 103 according to the third exemplary embodiment, the work function of the second layer 712 has a value between the work function of the first layer 711 and the work function of the third layer 713. Thus, the work function at the interface between the first layer 711 and the second layer 712 stacked from the organic emission layer 720 is higher than the work function at the interface between the first layer 711 and the third layer 713 generated when the first layer 711 and the third layer 713 are in direct contact with each other. That is, the organic light emitting diode display 103 according to the third exemplary embodiment can suppress a decrease in work function at the interface of a neighboring layer, thus improving the emission efficiency of the organic emission layer 720. Furthermore, the driving voltage for driving the organic emission layer 720 is lowered, so the lifespan of the organic emission layer 720 is enhanced.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   a first electrode arranged on a substrate;
   an organic emission layer arranged on the first electrode;
   a second electrode arranged on the organic emission layer, wherein the first electrode includes a first layer, a second layer and a third layer stacked sequentially on the organic emission layer, the second layer has a higher work function than that of the third layer, wherein the first layer has a higher work function than the second layer, and wherein the second layer is thinner than each of the first layer and the third layer; and
   an interlayer insulating layer arranged directly on the third layer, wherein the first electrode is composed of only the first, second and third layers.

2. The organic light emitting diode display of claim 1, further comprising a thin film transistor arranged on the substrate and including a source electrode and a drain electrode, the source electrode and the drain electrode each include the first layer, the second layer and the third layer.

3. The organic light emitting diode display of claim 1, wherein the second layer comprises a material selected from a group consisting of silver (Ag), molybdenum (Mo), tungsten (W), nickel (Ni) and platinum (Pt).

4. The organic light emitting diode display of claim 3, the first layer includes indium tin oxide (ITO) and the third layer includes a different conductive material than that of the second layer.

5. The organic light emitting diode display of claim 3, the first layer includes a nickel oxide (NiOx), the second layer includes aluminum (Al) and the third layer includes a different conductive material than that of the second layer.

6. The organic light emitting diode display of claim 5, wherein the first layer is doped with lithium.

7. The organic light emitting diode display of claim 3, further comprising a thin film transistor arranged on the substrate and including a source electrode and a drain electrode, the source electrode and the drain electrode each include the first layer, the second layer and the third layer, wherein the second layer is thinner than each of the first layer and the third layer.

8. The organic light emitting diode display of claim 1, wherein the first layer comprises indium tin oxide (ITO), the second layer comprises silver (Ag) and the third layer comprises aluminum (Al).

9. An organic light emitting diode display, comprising:
a first electrode arranged on a substrate;
an organic emission layer arranged on the first electrode; and
a second electrode arranged on the organic emission layer, wherein the first electrode includes a first layer, a second layer and a third layer stacked sequentially on the organic emission layer, the second layer has a higher work function than that of the third layer, wherein the first layer has a higher work function than the second layer, and wherein the second layer is thinner than each of the first layer and the third layer, wherein the first electrode further comprises a fourth layer arranged on the third layer, the first layer includes indium tin oxide (ITO), the second layer comprises a material selected from a group consisting of silver (Ag), molybdenum (Mo), tungsten (W), nickel (Ni) and platinum (Pt), the third layer includes aluminum (Al), and the fourth layer includes a different conductive material than that of the third layer.

10. The organic light emitting diode display of claim 9, wherein the second layer comprises silver (Ag).

11. An organic light emitting diode display, comprising:
a first electrode arranged on a substrate;
an organic emission layer arranged on the first electrode; and
a second electrode arranged on the organic emission layer, wherein the first electrode includes a first layer, a second layer, a third layer and a fourth layer stacked sequentially on the organic emission layer, wherein the second layer has a work function in between the work function of the third layer and the work function of the first layer, wherein the third layer comprises aluminum (Al) and the second layer comprises a material selected from a group consisting of silver (Ag), molybdenum (Mo), tungsten (W), nickel (Ni) and platinum (Pt).

12. The organic light emitting diode display of claim 11, further comprising an interlayer insulating layer arranged directly on the fourth layer.

13. The organic light emitting diode display of claim 11, wherein the first layer and the fourth layer each comprise indium tin oxide (ITO).

* * * * *